(12) United States Patent
Kim et al.

(10) Patent No.: US 8,183,611 B2
(45) Date of Patent: May 22, 2012

(54) SPIN TRANSISTOR USING N-TYPE AND P-TYPE DOUBLE CARRIER SUPPLY LAYER STRUCTURE

(75) Inventors: Hyung Jun Kim, Seoul (KR); Jin Dong Song, Seoul (KR); Hyun Cheol Koo, Seoul (KR); Kyung Ho Kim, Seoul (KR); Suk Hee Han, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 94 days.

(21) Appl. No.: 12/858,702

(22) Filed: Aug. 18, 2010

(65) Prior Publication Data

US 2011/0284937 A1   Nov. 24, 2011

(30) Foreign Application Priority Data

May 18, 2010  (KR) .................. 10-2010-0046364

(51) Int. Cl.
*H01L 29/76* (2006.01)
(52) U.S. Cl. .. 257/295; 257/421; 257/902; 257/E29.323
(58) Field of Classification Search .................. 257/295, 257/421, 902, E29.323
See application file for complete search history.

(56) References Cited

U.S. PATENT DOCUMENTS

| 5,038,187 A * | 8/1991 | Zhou ............................ 257/194 |
| 7,307,299 B2 | 12/2007 | Koo et al. |
| 7,608,901 B2 * | 10/2009 | Koo et al. ..................... 257/421 |
| 7,675,103 B2 * | 3/2010 | Koo et al. ..................... 257/295 |
| 2008/0308844 A1 | 12/2008 | Koo et al. |

FOREIGN PATENT DOCUMENTS

| JP | 2002-343958 A | 11/2002 |
| JP | 2008-166689 A | 7/2008 |
| KR | 10-0619300 B | 8/2006 |
| KR | 10-0709395 B | 4/2007 |

OTHER PUBLICATIONS

Supriyo Datta and Biswajit Das, "Electronic analog of the electro-optic modulator", Applied Physics Letter, vol. 56, pp. 665-667, Feb. 12, 1990.

* cited by examiner

*Primary Examiner* — Long Pham
(74) *Attorney, Agent, or Firm* — Renner, Otto, Boisselle & Sklar, LLP

(57) ABSTRACT

A spin transistor that includes: a semiconductor substrate including an upper cladding layer and a lower cladding layer, and a channel layer interposed between the upper and lower cladding layers; a ferromagnetic source and a ferromagnetic drain formed on the semiconductor substrate and spaced from each other in a length direction of the channel layer; and a gate electrode formed on the semiconductor substrate between the source and the drain and having applied a gate voltage thereto to control a spin precession of an electron passing through the channel layer, wherein the semiconductor substrate includes a first carrier supply layer of a first conductivity type disposed below the lower cladding layer and supplying carriers to the channel layer, and a second carrier supply layer of a second conductivity type opposite to the first conductivity type formed on the upper cladding layer and supplying the carriers to the channel layer.

12 Claims, 4 Drawing Sheets

SPIN TRANSISTOR USING N-TYPE AND P-TYPE DOUBLE CARRIER SUPPLY LAYER STRUCTURE

CROSS-REFERENCE TO RELATED APPLICATIONS

This application claims the priority of Korean Patent Application No. 10-2010-0046364 filed on May 18, 2010, in the Korean Intellectual Property Office, the disclosure of which is incorporated herein by reference.

BACKGROUND OF THE INVENTION

1. Field of the Invention

The present invention relates to a spin transistor, and more particularly, to a spin transistor having a ferromagnetic source/drain and a semiconductor channel.

2. Description of the Related Art

A spin transistor (or a spin FET) as one of several new-concept devices for solving the physical limitations of conventional electronic devices has widely been researched. Since a spin transistor using a two-dimensional electron gas (2-DEG) layer as a channel was proposed by Datta and Das in 1990 (see Applied Physics Letter, vol 56, 665, 1990), research into the transport (spin injection) of spin-polarized electrons and research into adjusting the spin precession of the spin-polarized electrons have been progressing in a hybrid structure in which a semiconductor is combined with a ferromagnetic material.

In order to perform a basic operation of a spin transistor using electron spin precession, spin-polarized electrons should be essentially injected from the ferromagnetic into semiconductor, and a gate electrode should be ultimately used to control the spin precession of the spin-polarized electrons injected into the 2-dimensional electron gas channel. In this case, a spin-orbit interaction in the 2-dimensional electron gas channel should be high in order to effectively control the spin precession, and a suitable electric resistance between the ferromagnetic and the semiconductor should be maintained to observe a spin injection signal in an electrical manner. The intensity of the spin-orbit interaction may be quantified by employing a spin-orbit coupling constant ($\alpha$) that may be obtained by an SdH (Shubnikov de Haas) oscillation experiments. Up to now, a channel structure based on an InAs 2-DEG layer has been known as a materials that best satisfies the above-mentioned requirements.

A semiconductor technology based on silicon is prominent in a modern industry. The semiconductor is designed and manufactured based on MOSFET (metal oxide semiconductor field effect transistor). The conventional transistor based on the semiconductor controls electrical charges in the semiconductor by using an electrical field, while a spin transistor controls both the electrical charges and the spin. There are attempts to using the spin transistor in a switching device, a logic circuit, and the like by controlling the spin-polarized electrons. When there is an electrical field E that is vertical to a wave vector k of electrons moving in the 2-DEG channel, a magnetic field is formed as $H_{Rashba} \propto k \times E$ by the spin-orbit interaction. This is referred to as the Rashba effect. When current flows in an x direction and the electrical field is applied in a z direction by a gate voltage, a magnetic field induced by a spin-orbit interaction effect is formed in a y direction. The spin-polarized electrons injected into the channel of the spin transistor begin spin precession by the magnetic field and the gate voltage can be used to adjust a precession angle.

In order to supply the electrical charges to the 2-DEG channel that links a source and a drain of the spin transistor with each other, a carrier supply layer may be formed below the channel. Such a structure is known as an inverted structure. However, in the known spin transistor structure in which the carrier supply layer is positioned below the channel, a variation of a potential gradient of the channel is limited and there is therefore a limit to acquiring high spin-orbit interaction.

SUMMARY OF THE INVENTION

An aspect of the present invention provides a spin transistor having improved spin-orbit interaction by increasing a potential gradient of a channel.

According to an aspect of the present invention, there is provided a spin transistor that includes: a semiconductor substrate including an upper cladding layer and a lower cladding layer, and a channel layer interposed between the upper and lower cladding layers; a ferromagnetic source and a ferromagnetic drain formed on the semiconductor substrate and spaced from each other in a length direction of the channel layer; and a gate electrode formed on the semiconductor substrate between the source and the drain and having a gate voltage applied thereto to control a spin precession of an electron passing through the channel layer. The semiconductor substrate includes a first carrier supply layer of a first conductivity type disposed below the lower cladding layer and supplying carriers to the channel layer, and a second carrier supply layer of a second conductivity type opposite to the first conductivity type formed on the upper cladding layer and supplying the carriers to the channel layer.

An energy band structure and an electron distribution of the channel layer along a thickness direction of the semiconductor substrate may be asymmetric.

The first carrier supply layer may be an n-doped layer and the second carrier supply layer may be a p-doped layer. As another example, the first carrier supply layer may be the p-doped layer and the second carrier supply layer may be the n-doped layer.

The lower cladding layer may include a first lower cladding layer and a second lower cladding layer formed below the first lower cladding layer and having a larger band gap than the first lower cladding layer and the upper cladding layer may include a first upper cladding layer and a second upper cladding layer formed on the first upper cladding layer and having a larger band gap than the first upper cladding layer.

The channel layer may be formed of InAs, the first lower cladding layer and the first upper cladding layer may be formed of undoped InGaAs, and the second lower cladding layer and the second upper cladding layer may be formed of undoped InAlAs. Further, at least one of the first carrier supply layer and the second carrier supply layer may be formed of InAlAs.

Doping concentrations of the first carrier supply layer and the second carrier supply layer may be controlled to be different from each other so as to increase the asymmetricity of the energy band structure and the electron distribution in the channel layer.

The first carrier supply layer and the second carrier supply layer may be delta-doped or bulk-doped.

The upper cladding layer and the lower cladding layer may have different thicknesses, and the energy band structure and the electron distribution of the channel layer may be asymmetric.

When each of the upper cladding layer and the lower cladding layer has a dual cladding structure, the first upper cladding layer and the first lower cladding layer may have different thicknesses.

The channel layer may be formed of a semiconductor material selected from a group composed of GaAs, InAs, InGaAs, and InSb.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may, however, be embodied in many different forms and should not be construed as being limited to the embodiments set forth herein.

Figure 1:
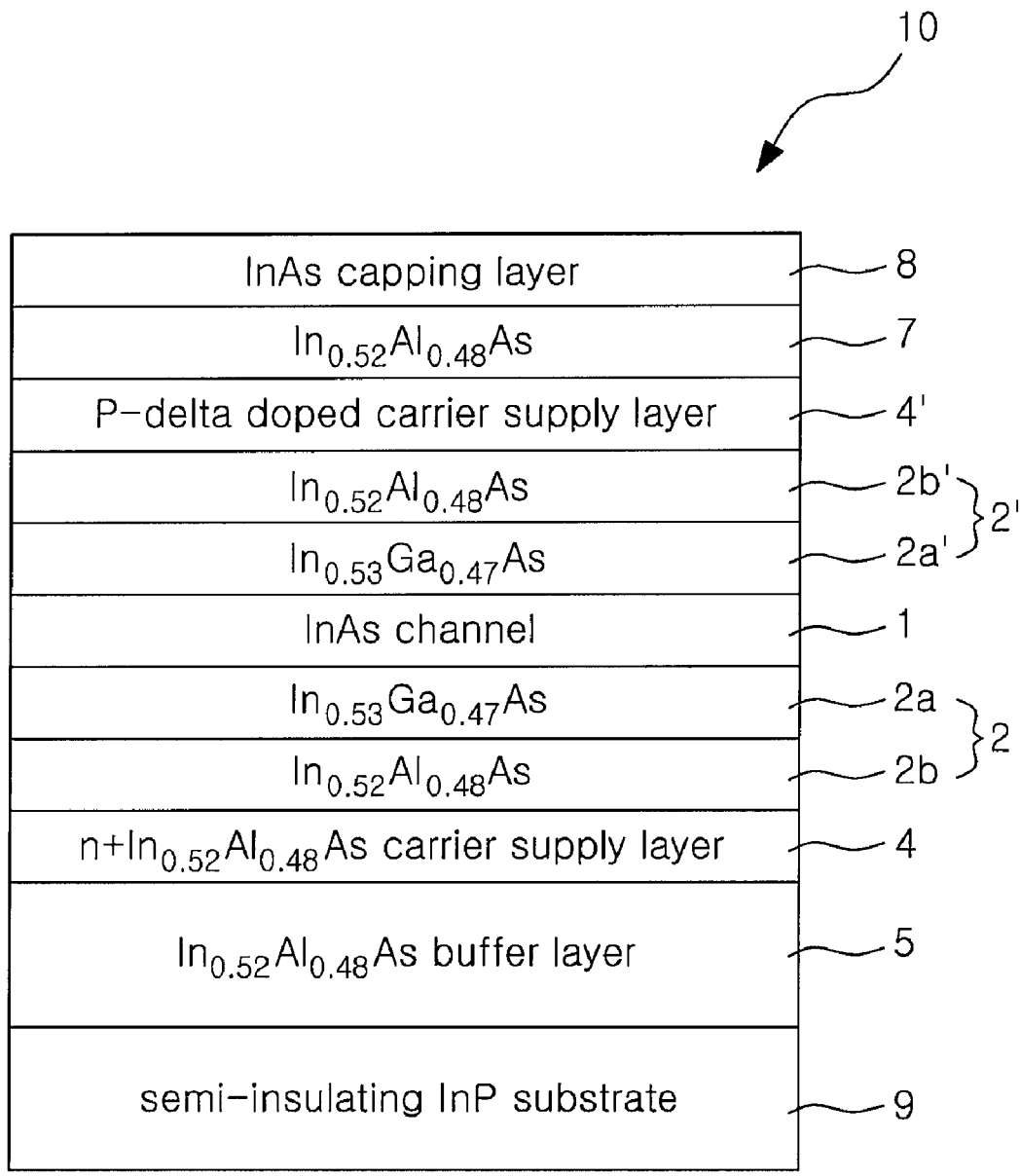
FIG. 1 is a diagram illustrating a cross-sectional structure of a semiconductor substrate of a spin transistor according to an exemplary embodiment of the present invention.

FIG. 1 is a diagram illustrating a cross-sectional structure of a semiconductor substrate of a spin transistor according to an exemplary embodiment of the present invention. Referring to FIG. 1, the semiconductor substrate 10 includes an InAlAs buffer layer 5, an n-doped InAlAs first carrier supply layer 4, an undoped InGaAs/InAlAs lower cladding layer 2, an InAs channel layer 1, an undoped InAlAs/InGaAs upper cladding layer 2', and a p-doped InAlAs second carrier supply layer 4' that are sequentially stacked on a semi-insulating InP substrate 9. An InAlAs layer 7 is additionally formed on a p-delta doped second carrier supply layer 4' and an InAs capping layer 8 is formed thereon.

Each of the lower cladding layer 2 and the upper cladding layer 2' has a dual cladding structure constituted by an undoped InGaAs layer and an InAlAs layer. That is, the lower cladding layer 2 includes a first lower cladding layer 2a made of the undoped InGaAs and a second lower cladding layer 2b formed below the first lower cladding layer 2a and made of the undoped InAlAs. The upper cladding layer 2' includes a first upper cladding layer 2a' made of the undoped InGaAs and a second upper cladding layer 2b' formed on the first upper cladding layer 2a' and made of the undoped InAlAs. The second lower cladding layer 2b has an energy band gap larger than the first lower cladding layer 2a, and the second upper cladding layer 2b' has an energy band gap larger than the first upper cladding layer 2a'.

The InAs channel layer 1 forms a quantum well by using energy barriers of the lower cladding layer 2 and the upper cladding layer 2'. In particular, electrical charges are confined to the channel layer 1 by the upper and lower cladding layers 2 and 2'. Therefore, the channel layer 1 forms a 2-dimensional electron gas (2-DEG) layer having high electron mobility. In the exemplary embodiment, InAs is used as the channel layer 1, but the present invention is not limited thereto. For example, GaAs, InGaAs, or InSb may be used as the channel layer having the 2-DEG structure. Further, in the exemplary embodiment, although a cladding layer having a double cladding structure is used, the present invention is not limited thereto and the cladding layer may have a single cladding structure. For example, the InAlAs layer may be used as the upper and lower cladding layer and the InGaAs layer may be used as the channel layer. In this case, the InGaAs channel layer may have the 2-DEG structure.

The relatively thick buffer layer 5 is formed to alleviate a lattice mismatch between the semi-insulating InP substrate 9 and the structure grown thereon (the first carrier supply layer 4 and the 2-DEG structure). The InAs capping layer 8 serves to prevent oxidation and degeneration of the semiconductor which may be generated when the semiconductor substrate is exposed to air after its manufacture.

The n-doped InAlAs first carrier supply layer 4 supplying electrical charges (carriers) to the 2-DEG channel layer is disposed below the lower cladding layer 2. The p-delta doped second carrier supply layer 4' which has a doping type opposite to that of the first carrier supply layer 4 is disposed on the upper cladding layer 2'. As described below, when a 'double carrier supply layer structure of different doping types' in which the carrier supply layers 4 and 4' having the different doping types are provided in the upper and lower parts of the channel layer 1 is used, the potential gradient in the spin transistor channel further increases and as a result, the spin-orbit interaction is improved in comparison with a 'single carrier supply layer structure'. Herein, the 'single carrier supply layer structure' is a structure in which the carrier supply layer is provided in only the upper part or the lower part of the channel layer.

An energy band structure and electron distribution of the channel layer 1 may be further asymmetrical by disposing the carrier supply layers 4 and 4' of different doping types in the upper and lower parts of the channel layer 1. In particular, the asymmetricity of the energy band structure and the electron distribution in the channel layer 1 may be increased by adjusting the doping concentrations of the first carrier supply layer 4 and the second carrier supply layer 4' (see FIG. 4). The increase in the asymmetricity may further increase the potential gradient in the channel and further increase the spin-orbit interaction. In order to increase the asymmetricity of the energy band structure and the electron distribution in the channel layer 1, the upper cladding layer 2' and the lower cladding layer 2 may have different thicknesses. Further, in order to increase the asymmetricity of the energy band structure and the electron distribution in the channel layer 1, the first upper cladding layer 2a' and the first lower cladding layer 2a may have different thicknesses.

In the exemplary embodiment, the second carrier supply layer 4' is delta-doped and the first carrier supply layer 4 is bulk-doped, but the present invention is not limited thereto. The first and second carrier supply layers 4 and 4' may be bulk-doped or delta-doped. For example, the first carrier supply layer 4 disposed below the lower cladding layer 2 may be an n-delta doped layer and the second carrier supply layer 4' disposed above the upper cladding layer 2' may be the p bulk-doped InAlAs layer. In the above-mentioned exemplary embodiment, the lower first carrier supply layer 4 is an n-doped layer and the upper second carrier supply layer 4' is a p-doped layer, but the present invention is not limited thereto. The lower first carrier supply layer 4 may be the p-doped player and the upper second carrier supply layer 4' may be the n-doped layer.

The bulk-doped carrier supply layer may be formed by uniformly distributing a dopant (in the case of n-dope, Si, and the like) in, for example, the InAlAs layer. The delta-doped carrier supply layer may be implemented, for example, by merely forming a very thin Si (n-type dopant) or Be (p-type dopant) layer without the InAlAs layer in order to markedly increase the doping concentration. That is, the delta-doped layer may be formed by forming a thin layer made of a dopant material.

Figure 2:
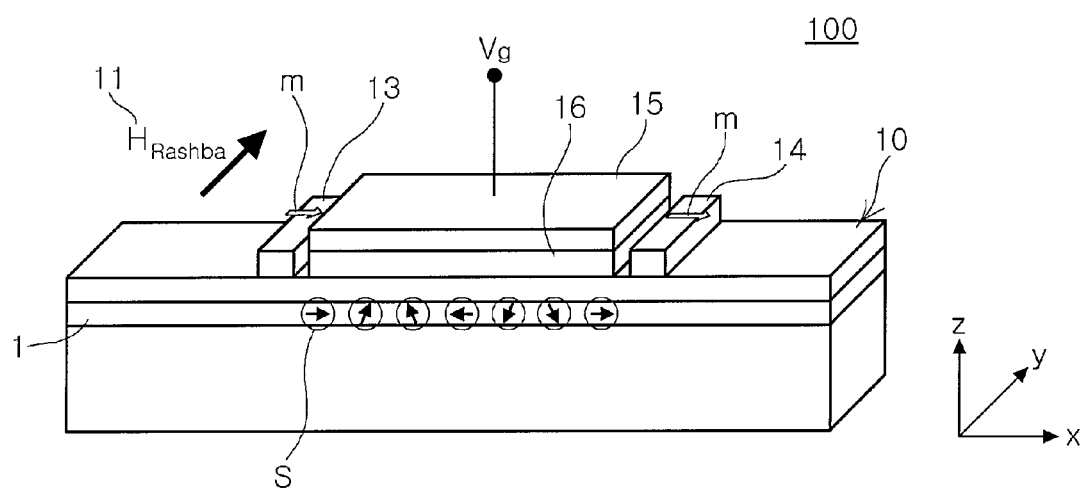
FIG. 2 is a perspective view illustrating a schematic structure of a spin transistor according to an exemplary embodiment of the present invention.

FIG. 2 is a perspective view illustrating one example of a schematic structure which a spin transistor according to an exemplary embodiment of the present invention can adopt. The spin transistor 100 of FIG. 2 may use a semiconductor substrate 10 having the cross-sectional structure of FIG. 1. Referring to FIG. 2, the spin transistor 100 includes the semiconductor substrate 10 having the channel 1, and a ferromagnetic source 13 and a ferromagnetic drain 14 disposed on the semiconductor substrate 10 to be spaced from each other in the direction of the channel 1. A gate electrode 15 is disposed on the semiconductor substrate 10 between the source 13 and the drain 14. The gate electrode 15 is insulated from the semiconductor substrate 10 by a gate insulating layer 16 such as $SiO_2$. Magnetization directions m of the ferromagnetic source 13 and the ferromagnetic drain 14 may be, for example, an X-axis direction parallel to a length direction of the channel as shown in the figure.

A basic operation of the spin transistor 100 may be described below, for example. Spin electrons parallel to the magnetization direction m of the ferromagnetic source 13 is injected from the source 13 to the semiconductor channel layer 1 to move through a semiconductor channel. At this time, since a magnetic field ($H_{Rashba}$) 11 induced by the spin-orbit interaction is parallel to the y axis, the spin electrons passing through the channel layer 1 precess on an x-z plane. Arrows displayed on the channel layer 1 sequentially indicate precessions of spin-polarized electrons S. By adjusting a precession level of the electron injected into the channel 1 by using the gate voltage Vg, the spin electrons S reach the drain 14 with a +x direction spin or −x direction spin so as to control a state of the spin transistor 100 to be "ON" or "OFF". In this case, the spin-orbit interaction may be strengthened by disposing the carrier supply layers 4 and 4' having the different doping types above and below the channel 1 (see FIG. 1). As a result, it is possible to control the precession of the electron in the channel 1 and the on/off state of the spin transistor 100 by means of the precession of the electrons more easily and effectively.

Specifically, it is possible to increase the spin-orbit interaction constant by increasing the magnitude of the potential gradient in the channel 1 through the double electrical supply layer structures 4 and 4' of the different doping types. As a result, it is possible to acquire an optimal channel length between the source 13 and the drain 14 and effectively control the spin precession caused by the gate voltage.

Figure 3:
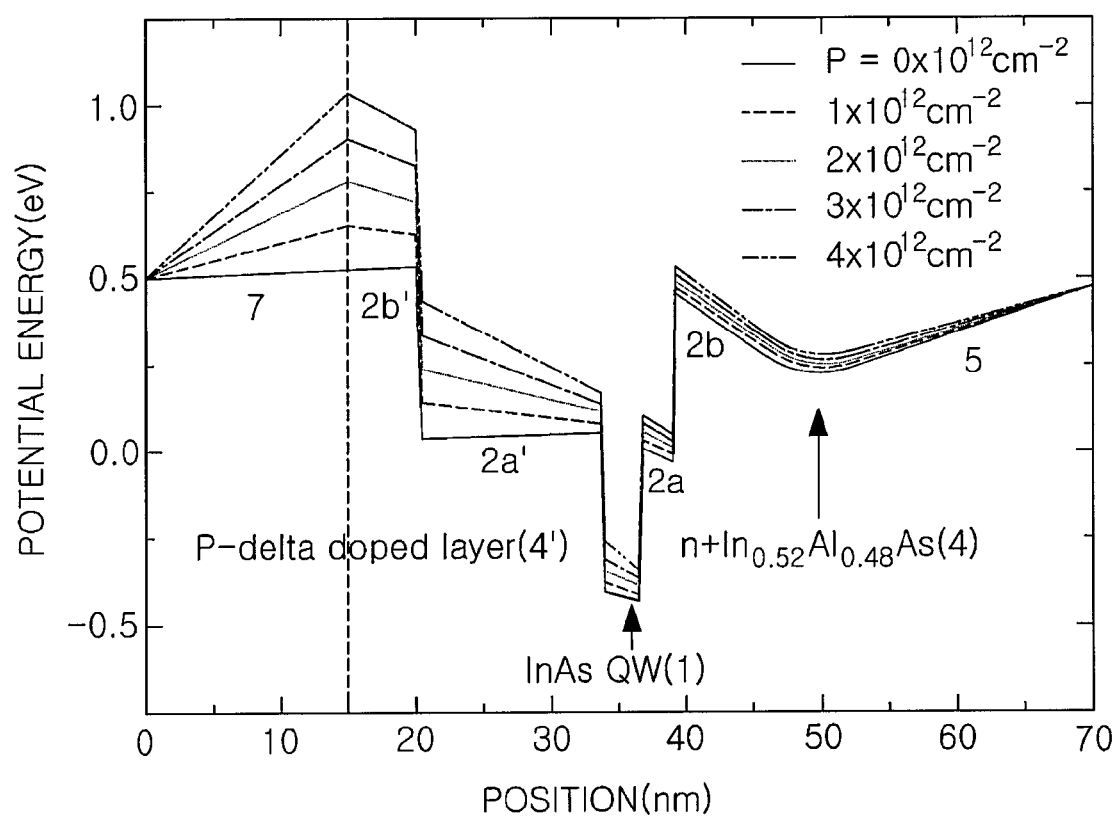
FIG. 3 is a graph illustrating an energy band structure of a semiconductor substrate (including a channel layer, cladding layers, and carrier supply layers) of a spin transistor depending on a doping concentration of a p-doped carrier supply layer.

FIG. 3 shows a variation of an energy band structure depending on a variation of a doping concentration of a p-doped second carrier supply layer 4' in the semiconductor substrate 10 having a 2-DEG channel structure shown in FIG. 1. The InAs channel layer 1 forms a quantum well QW in the energy band structure as shown in FIG. 3. A structure with no p-doped carrier supply layer, that is, the doping concentration P of 0 corresponds to the single carrier supply layer structure in which the n-doped carrier supply layer 4 is positioned below the channel 1. As shown in FIG. 3, as the doping concentration of the p-doped carrier supply layer 4' increases, the potential gradient markedly increases in all layers (including the channel layer, the upper cladding layer, and the lower cladding layer) for the 2-DEG structure. FIG. 3 illustrates an energy band structure when the gate voltage is 0.

Figure 4:
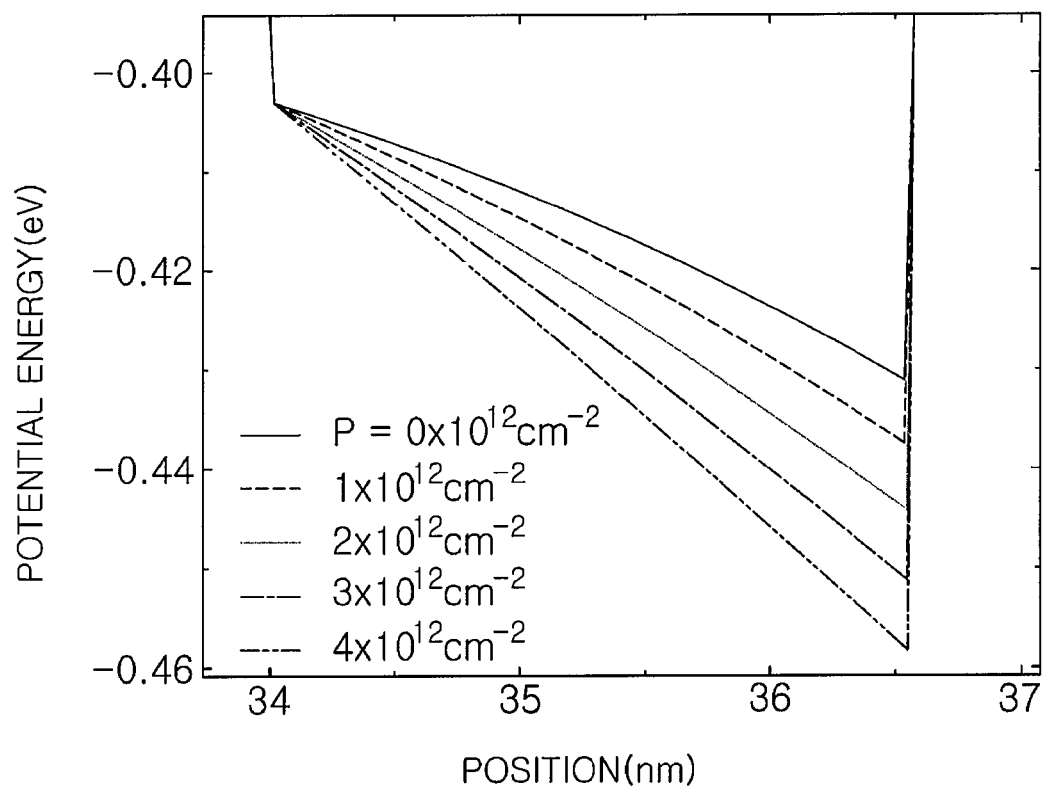
FIG. 4 is a graph illustrating a variation of a potential gradient in a channel layer of a spin transistor depending on a doping concentration of a p-doped carrier supply layer.

FIG. 4 is an enlarged graph illustrating a variation of a potential gradient in an InAs channel layer depending on a variation of a doping concentration of the p-doped carrier supply layer 4 of FIG. 3. As more clearly shown in FIG. 4, as the p-type doping concentration increases, the magnitude of the potential gradient has a larger value in the InAs channel layer 1 (that is, the potential line is steeper). This shows that the 'double carrier supply layers of the different doping types' in which the carrier supply layers 4 and 4' having opposite doping types are formed in the upper and lower parts of the channel provide a larger potential gradient in the channel than the single carrier supply layer in which a carrier supply layer is formed in only one of the upper part or the lower part of the channel. As a result, it is possible to acquire a spin transistor having improved spin-orbit interaction.

As set forth above, according to an exemplary embodiment of the present invention, it is possible to increase the magnitude of a potential gradient of a channel by using a double carrier supply layer structure in which two different conductive supply layers are disposed with the channel interposed therebetween. As a result, spin-orbit interaction is improved. Accordingly, it is possible to effectively control the precession of a spin injected into a channel layer.

While the present invention has been shown and described in connection with the exemplary embodiments, it will be apparent to those skilled in the art that modifications and variations can be made without departing from the spirit and scope of the invention as defined by the appended claims.

What is claimed is:

1. A spin transistor, comprising:
   a semiconductor substrate including an upper cladding layer and a lower cladding layer, and a channel layer interposed between the upper and lower cladding layers;
   a ferromagnetic source and a ferromagnetic drain formed on the semiconductor substrate and spaced from each other in a length direction of the channel layer; and
   a gate electrode formed on the semiconductor substrate between the source and the drain and having a gate voltage applied thereto to control a spin precession of an electron passing through the channel layer,
   wherein the semiconductor substrate includes,
   a first carrier supply layer of a first conductivity type disposed below the lower cladding layer and supplying carriers to the channel layer, and
   a second carrier supply layer of a second conductivity type opposite to the first conductivity type formed on the upper cladding layer and supplying the carriers to the channel layer.

2. The spin transistor of claim 1, wherein an energy band structure and an electron distribution of the channel layer along a thickness direction of the semiconductor substrate are asymmetric.

3. The spin transistor of claim 1, wherein the first carrier supply layer is an n-doped layer and the second carrier supply layer is a p-doped layer.

4. The spin transistor of claim 1, wherein the first carrier supply layer is the p-doped layer and the second carrier supply layer is the n-doped layer.

5. The spin transistor of claim 1, wherein the lower cladding layer includes a first lower cladding layer and a second lower cladding layer formed below the first lower cladding layer and having a larger band gap than the first lower cladding layer, and the upper cladding layer includes a first upper cladding layer and a second upper cladding layer formed on the first upper cladding layer and having a larger band gap than the first upper cladding layer.

6. The spin transistor of claim 5, wherein the channel layer is formed of InAs, the first lower cladding layer and the first upper cladding layer are formed of undoped InGaAs, and the second lower cladding layer and the second upper cladding layer are formed of undoped InAlAs.

7. The spin transistor of claim 6, wherein at least one of the first carrier supply layer and the second carrier supply layer is formed of InAlAs.

8. The spin transistor of claim 5, wherein the first upper cladding layer and the first lower cladding layer have different thicknesses.

9. The spin transistor of claim 1, wherein doping concentrations of the first carrier supply layer and the second carrier supply layer are controlled to be different from each other so as to increase the asymmetricity of the energy band structure and the electron distribution in the channel layer.

10. The spin transistor of claim 1, wherein the first carrier supply layer and the second carrier supply layer are delta-doped or bulk-doped.

11. The spin transistor of claim 1, wherein the upper cladding layer and the lower cladding layer have different thicknesses, and the energy band structure and the electron distribution of the channel layer are asymmetric.

12. The spin transistor of claim 1, wherein the channel layer is formed of semiconductor material selected from the group consisting of GaAs, InAs, InGaAs and InSb.

* * * * *